US009653159B2

(12) United States Patent
McCreery et al.

(10) Patent No.: US 9,653,159 B2
(45) Date of Patent: May 16, 2017

(54) MEMORY DEVICE BASED ON CONDUCTANCE SWITCHING IN POLYMER/ELECTROLYTE JUNCTIONS

(75) Inventors: Richard L. McCreery, Ottawa (CA); Lian C. T. Shoute, Ottawa (CA); Yiliang Wu, Oakville (CA)

(73) Assignees: XEROX CORPORATION, Norwalk, CT (US); NATIONAL RESEARCH COUNCIL OF CANADA, Ottawa (CA)

( * ) Notice: Subject to any disclaimer, the term of this patent is extended or adjusted under 35 U.S.C. 154(b) by 452 days.

(21) Appl. No.: 13/352,597

(22) Filed: Jan. 18, 2012

(65) Prior Publication Data
US 2013/0182520 A1  Jul. 18, 2013

(51) Int. Cl.
*G11C 7/00* (2006.01)
*G11C 13/00* (2006.01)
*H01L 45/00* (2006.01)

(52) U.S. Cl.
CPC ........ *G11C 13/0016* (2013.01); *G11C 13/004* (2013.01); *G11C 13/0069* (2013.01); *H01L 45/08* (2013.01); *H01L 45/1206* (2013.01); *H01L 45/14* (2013.01); *G11C 2213/15* (2013.01); *G11C 2213/17* (2013.01); *G11C 2213/53* (2013.01)

(58) Field of Classification Search
CPC ............ G11C 2213/56; G11C 2213/50; G11C 2213/30
USPC ................ 365/148, 158, 163, 171, 173, 218
See application file for complete search history.

(56) References Cited

U.S. PATENT DOCUMENTS

| 5,202,261 | A | * | 4/1993 | Musho | C12Q 1/002 204/403.09 |
|---|---|---|---|---|---|
| 6,960,783 | B2 | | 11/2005 | Lan et al. | |
| 7,027,327 | B2 | | 4/2006 | Yamamoto et al. | |
| 7,141,844 | B1 | * | 11/2006 | Kingsborough | ............... 257/296 |
| 7,221,599 | B1 | * | 5/2007 | Gaun | ....................... G11C 7/20 365/151 |
| 7,544,966 | B2 | | 6/2009 | Yang et al. | |

(Continued)

FOREIGN PATENT DOCUMENTS

WO    02071505 A1    12/2002

OTHER PUBLICATIONS

Verma, Sarves et al., "Operational Voltage Reduction of Flash Memory Using High-κ Composite Tunnel Barriers," IEEE Electron Device Letters, Mar. 2008, vol. 29, No. 3.

(Continued)

*Primary Examiner* — Tha-O H Bui
(74) *Attorney, Agent, or Firm* — Pillsbury Winthrop Shaw Pittman LLP

(57) ABSTRACT

A non-volatile memory device including at least a first electrode and a second electrode provided on a substrate, the first and second electrodes being separated from each other; an organic semiconductive polymer electrically connecting the first and second electrodes; an electrolyte in contact with the organic semiconductive polymer; and a third electrode that is not in contact with the first electrode, the second electrode, and the organic semiconductive polymer; wherein the organic semiconductive polymer has a first redox state in which it exhibits a first conductivity, and a second redox state in which it exhibits a second conductivity.

22 Claims, 4 Drawing Sheets

(56) References Cited

U.S. PATENT DOCUMENTS

| | | | |
|---|---|---|---|
| 2004/0246768 A1* | 12/2004 | Krieger | B82Y 10/00 |
| | | | 365/154 |
| 2005/0084660 A1 | 4/2005 | Kojima et al. | |
| 2005/0111071 A1 | 5/2005 | Kojima et al. | |
| 2006/0245235 A1 | 11/2006 | Krieger et al. | |
| 2008/0135834 A1 | 6/2008 | Kaza et al. | |
| 2011/0297234 A1 | 12/2011 | Forrest et al. | |
| 2012/0187387 A1* | 7/2012 | Sekiguchi | H01L 51/5032 |
| | | | 257/40 |

OTHER PUBLICATIONS

Berzina, et al., Optimization of an Organic Memristor as an Adaptive Memory Element, (Jul. 24, 2009), pp. 12415-1-12415-5, Italy.
European Patent Office Search Report dd Feb. 18, 2015, Ref. No. 20111344-EP-EPA for Appln. No. 13151331.9-1556 / 2618393, 5 pages.

\* cited by examiner

MEMORY DEVICE BASED ON CONDUCTANCE SWITCHING IN POLYMER/ELECTROLYTE JUNCTIONS

TECHNICAL FIELD

The present disclosure relates to a non-volatile memory, such as a memory suitable for use as storage medium, such as, for example, a memory card or a component of a computer system, which maintains information even after the power is turned off. More specifically, the present disclosure relates to a high density, non-volatile memory device for data processing and storage, particularly a high density, non-volatile memory device including a polymer/electrolyte junction that is based on organic semiconductor materials, which may be operated on a flexible substrate.

BACKGROUND

Recently, the increasing demand for computers has caused the industries in the field of memory devices to develop rapidly. The market has demanded products of higher performance and lower costs, which leads to a fierce competition on the supply side that has been trying to meet the demand. One of the significant factors in determining the performance of a computer is a storage device, and the mainstream of the same is a semiconductor memory configured so that memory cells are formed on a semiconductor substrate such as silicon. The main requirements for the high performance of the semiconductor memory are "high speed of input/output to/from memory", "large capacity of memory", and "stability of storage." Computers comprising storage devices including silicon based electronics may have various configurations to meet various demands of the market, but in the case where both higher speed and larger capacity are pursued, the cost rises.

Worldwide sale of stand-alone and embedded solid state microelectronic memory is approximately $65 billion/year. Existing microelectronic memory is either fast and temporary (for example, DRAM) or slow and permanent (for example, magnetic storage). DRAM must be refreshed more than 10 times per second, with attendant power and overhead requirements. Non-volatile memory is not amenable to integration with microelectronic circuits, with the exception of "flash" memory, which has a limited number of write/erase cycles and requires high voltage (greater than 15 V) to operate. Flash memory (generally has a cycle life of approximately 10000 write/erase cycles) is significantly slower than DRAM, although it has good retention (greater than 10 yrs). In addition, flash memory has reliability problems with increasing density, due to crosstalk and limited cycle life. The less than 100 milli-second retention of DRAM is tolerated due to its high density, speed, and endurance, but longer retention could significantly reduce power consumption and broaden applications.

Important drawbacks of silicon based electronics are their rigidity and requirement of high temperature for fabrication. These properties impede their applications as devices on flexible substrates such as plastics, cloths, and papers. Printed electronics on flexible surfaces is projected to be the growth areas for future electronics with values of approximately $25 billion/year by 2015. The active component of organic and plastic based electronic devices is inherently flexible and can readily be adapted to a printing process. Thus, there is a need for a non-volatile memory with significantly reduced power consumption, faster write/erase speed, longer cycle life than Flash, and low manufacturing cost.

SUMMARY

Disclosed herein is a non-volatile memory device, comprising at least a first electrode and a second electrode provided on a substrate, the first and second electrodes being separated from each other; an organic semiconductive polymer electrically connecting the first and second electrodes; an electrolyte in contact with the organic semiconductive polymer; and a third electrode that is not in contact with the first electrode, the second electrode, and the organic semiconductive polymer; wherein the organic semiconductive polymer has a first redox state in which it exhibits a first conductivity, and a second redox state in which it exhibits a second conductivity.

EMBODIMENTS

Figure 1:
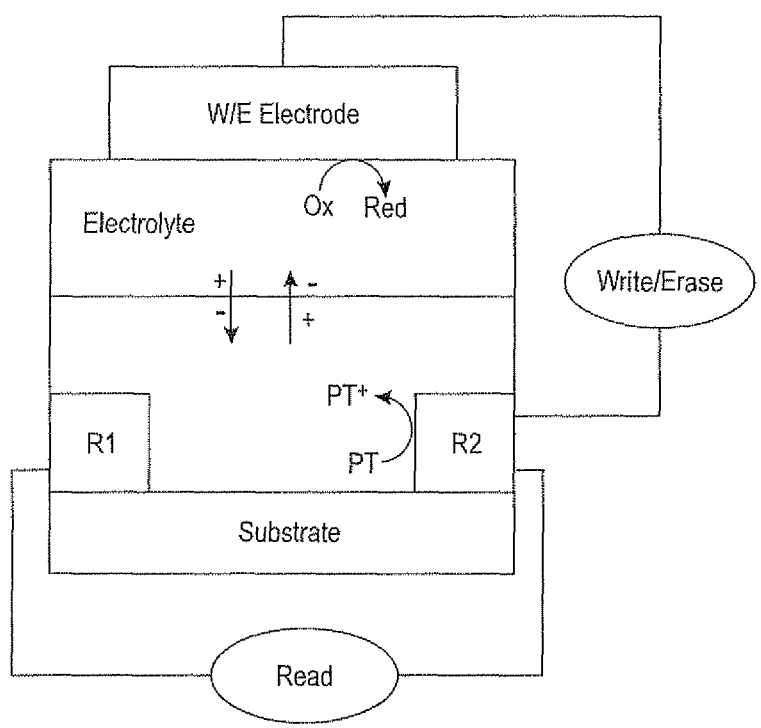
FIG. 1 represents a simplified side view of an exemplary memory device of the present disclosure.

A more complete understanding of the components, processes, and devices disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

In this specification and the claims that follow, singular forms such as "a," "an," and "the" include plural forms unless the content clearly dictates otherwise. All ranges disclosed herein include, unless specifically indicated, all endpoints and intermediate values. In addition, reference may be made to a number of terms that shall be defined as follows:

"Optional" or "optionally" refers, for example, to instances in which subsequently described circumstance may or may not occur, and include instances in which the circumstance occurs and instances in which the circumstance does not occur.

The terms "one or more" and "at least one" refer, for example, to instances in which one of the subsequently described circumstances occurs, and to instances in which more than one of the subsequently described circumstances occurs.

In embodiments, the memory device of the present disclosure is a "resistance switching" memory device, as opposed to a "charge storage" memory, such as DRAM. "Resistance switching" memory devices involve a conductance change, which is much more stable and can be read non-destructively.

In embodiments, the memory device of the present disclosure may comprise an active layer comprising an organic semiconducting polymer and optionally an electrolyte layer in contact with the organic semiconducting polymer. In embodiments, the memory device of the present disclosure includes electrodes in a three-terminal geometry in which the oxidation and reduction of an active layer (comprising an organic semiconducting polymer) bring about a change in conductivity of the organic semiconducting polymer. In further embodiments, the presence of a redox counter-reaction may be employed to enable switching between two metastable states of the organic semiconducting polymer. Additionally, one or more mobile ions may be present to stabilize the oxidized organic semiconducting polymer and increase retention. In embodiments, organic semiconducting polymer is a conducting layer that may contain mobile ions and/or charge transport complexes, to promote organic semiconducting polymer oxidation and reduction in "solid" state. In further embodiments, the readout of conductance may occur by a separate circuit from that involved in writing and erasing.

The term "organic semiconductive polymer" refers, for example, to organic polymer material having a conductivity that can be electrochemically altered through changing of the redox state of said organic material. When reference is made to changes in the "redox state" of the organic semiconductive polymer, this is intended to include cases where the organic semiconductive polymer is either oxidized or reduced, as well as cases where there is a redistribution of charges within the organic semiconductive polymer.

FIG. 1 illustrates an exemplary embodiment or configuration of a memory device of the present disclosure. In embodiments, the memory device may comprise a substrate arranged either below or optionally in contact with at least two read electrodes (R1 and R2), and the organic semiconducting polymer layer. In embodiments, the organic semiconducting polymer layer may run over and/or between the at least two read electrodes (R1 and R2). In embodiments, an electrolyte layer may be over and/or on top of the organic semiconducting polymer layer. In embodiments, one or more write/erase electrodes (W/E electrode) may be on top of the electrolyte layer and may or may not be in contact with the organic semiconducting polymer layer. In embodiments, optional interfacial layers may be located above or below the electrolyte layer, such as one or more layers comprising a complementary redox agent on top of and/or in contact with the electrolyte layer, both of which being above the organic semiconducting polymer layer.

It is important that the electrolyte layer separate the W/E electrode, the third electrode, from the organic semiconducting polymer layer. The read electrodes (the first and the second electrodes) have to be in contact with the organic semiconductive polymer. Without limited to any theory, it is believed that the redox chemistry (oxidation/reduction) of the organic semiconductive polymer takes place at the surfaces of the first and the second electrode. Ideally, a counter redox reaction takes place at the surface of the W/E electrode (the third electrode), for example with the complementary redox agent. The components of the redox counter reaction (Ox and Red) may be contained in the electrolyte layer, or may be in a separate layer between the W/E electrode and the electrolyte layer.

The exemplary memory device in FIG. 1 is similar to a redox cell, with the addition of a component whose conductivity depends on redox state, and electrodes positioned to measure conductivity within this component (R1 and R2). Without being bound by theory, it is thought that mobile ions in the electrolyte layer stabilize the conducting polaron state by compensating the space charge to maintain local electroneutrality. Furthermore, mobile ions in the active semiconducting polymer layer should promote polymer oxidation and reduction by screening the polymer from the applied voltage through formation of an ionic "double layer."

In embodiments, the memory device of the present disclosure is based on conductance switching in organic semiconducting polymer/electrolyte junctions. In embodiments, the memory device of the present disclosure includes at least two electrodes that are in electrical contact with the organic semiconductive polymer such that the recording and erasing of information may be perform using the difference in the conductivity of the organic semiconductive polymer. Such a memory device, which may be a non-volatile memory device, greatly reduces voltage requirements and provides better cycle life than conventional Flash memory. In addition, the energy required to "switch" a cell of the memory device of the present disclosure is approximately $\frac{1}{1000}$ of that required for even efficient conventional Flash devices, due to the fundamentally different memory mechanism of the memory device of the present disclosure.

An exemplary memory device of the present disclosure may employ an organic semiconductive polymer, which has at least a first conductivity and a second conductivity, to which at least a first electrode and a second electrode may be electrically connected (and optionally a third electrode may be electrically connected). In embodiments, the organic semiconductive polymer has a first redox state in which it exhibits a first conductivity, and a second redox state in which it exhibits a second conductivity. In embodiments, the organic semiconductive polymer may be switched to the first redox state via an oxidation/reduction reaction. In embodiments, the first redox state of the organic semiconductive polymer may be switched to the second redox state of the organic semiconductive polymer via an oxidation/reduction reaction.

It should be noted that upon interaction of the redox active organic semiconductive polymer with an external stimulus (such as an electric field, a chemical species) to arrive at the first redox state (or the second redox state), the redox active organic semiconductive polymer undergoes a change in one or several physical properties, such as, for example, conductivity and redox state, among others such as, for example, light absorption characteristics, molecular weight. Likewise, the redox organic semiconductive polymer may also undergo a change in several physical properties at the same time, upon interaction with the appropriate current, such as the conductivity and redox state. In contrast to conventional memory devices, the memory devices of the present disclosure may use the direct readout of the conductivity of the organic semiconductive polymer brought about by changes of the redox state of the organic semiconductive polymer for recording, retrieving, reproducing and erasing of information.

In embodiments, the memory device of the present disclosure may be a three-terminal memory device containing an organic semiconductive polymer which may be dynamically "doped" to change its conductivity. In embodiments, the memory device of the present disclosure may have a configuration similar to conventional organic thin film transistors known in the art; however, as described above behaves completely differently. Conventional organic thin film transistor is based on electrostatic doping of the organic semiconductive polymer, while the memory device of the present disclosure involves redox chemistry.

For example, without being bound by theory, as illustrated in FIG. 1, the W/E electrode may be used to "switch" the polymer conductivity by a redox reaction, which is accompanied by ion motion and a redox counter-reaction. The "state" of the device is non-destructively read by two separate electrodes designated R1 and R2, with the two states (for example a first conductivity and a second conductivity) differing in conductivity such that a ratio of the first conductivity to the second conductivity is greater than about 10, such as where the ratio of the first conductivity to the second conductivity is in the range of from about 10 to about $10^{10}$, or 100 to about $10^9$, or 1000 to about $10^8$.

In embodiments, the "state" is retained until the W/E electrode again changes the redox state of the polymer. For example, the polymer might be polythiophene (PT), with the neutral state having a conductivity of approximately $10^{-8}$ S/cm, with the oxidized "polaron" state having a conductivity of greater than 0.1 S/cm.

An exemplary organic semiconductive polymer suitable for use in the memory device of the present disclosure may have any desired conductivity when it is in the neutral state, such as organic semiconductive polymer having a conductivity of about $10^{-8}$ S/cm to $10^{-3}$ S/cm when it is in the neutral state. In embodiments, the first conductivity of the organic semiconductive polymer is greater than about 0.001 S/cm at room temperature, such as greater than about 0.01 S/cm at room temperature or from about 0.01 to about 10 S/cm. In embodiments, the second conductivity of the organic semiconductive polymer is less than about 10 S/cm at room temperature, such as less than about 0.01 S/em at room temperature or less than about 0.001 S/cm.

In embodiments, the memory device may be a non-volatile memory device comprising an organic semiconductive polymer having at least a first conductivity and a second conductivity, an electrolyte in contact with the organic semiconductive polymer and a complementary redox agent. Exemplary complementary redox agent includes but not limited to viologen ClO4, TCNQ, azobenzene, Ag/AgCl, organic semiconductor, and the like. It should be noted that if an organic semiconductor is used as the complementary redox agent, it can be the same or different from the organic semiconductive polymer. When the organic semiconductor is used as the complementary redox agent, it is not in contact with the organic semiconductive polymer. In embodiments, the complementary redox agent may or may not be present in a layer that is separated from the organic semiconductor polymer layer by the electrolyte layer.

In embodiments, the organic semiconductive polymer may be arranged between, and in direct electrical contact with, at least two read electrodes, the organic semiconductive polymer being a material having the ability of electrochemically altering its conductivity through change of redox state thereof via interaction with a solidified electrolyte in direct electrical contact with the organic semiconductive polymer. In embodiments, at least one electrode (such as at least one W/E electrode) may be interposed between or in the vicinity of the organic semiconductive polymer and a solidified electrolyte in such a way that electron flow between the organic semiconductive polymer and the at least one electrode(s) is prevented. In embodiments, the flow of electrons between the electrodes is controllable by means of a voltage applied to at least one W/E electrode.

The term "solidified electrolyte" refers, for example, to an electrolyte, which at the temperatures at which it is used is sufficiently rigid that particles/flakes in the bulk therein are substantially immobilized by the high viscosity/rigidity of the electrolyte and that it doesn't flow or leak. The solidified electrolyte may be a solid polymeric electrolyte, an aqueous or organic solvent-containing gel, such as gelatine or a polymeric gel. Solidified electrolytes may also encompass liquid electrolyte solutions soaked into, or in any other way hosted by, an appropriate matrix material, such as a paper, a fabric or a porous polymer.

In embodiments, the solidified electrolyte may comprise a binder, such as one having gelling properties. Suitable binders may be selected from the group consisting of gelatine, a gelatine derivative, polyacrylic acid, polymethacrylic acid, poly(vinyl-pyrrolidone), polysaccharides, polyacrylamides, polyurethanes, polypropylene oxides, polyethylene oxides, poly-(styrene sulphonic acid) and poly(vinyl alcohol) and salts and copolymers thereof; and may optionally be cross-linked. The solidified electrolyte may also comprise an ionic salt, and optionally, or in addition to, a hygroscopic salt, such as magnesium chloride, to maintain water content, if desired, or alternatively an inorganic solid which exhibits ionic conduction of $Na^+$, $H^+$, $OH^-$, etc.

In embodiments, the at least two read electrodes and the organic semiconductive polymer may be formed as one layer of material, which may be continuous. In other embodiments, the at least two read electrodes could alternatively be formed from another electrically conducting material in direct electrical contact with the organic semiconductive polymer. In embodiments, to provide for the necessary electrochemical reactions, whereby the conductivity of the organic semiconductive polymer is changed, a solidified electrolyte may be arranged so that it is in direct electrical contact with both the organic semiconductive polymer and the at least one W/E electrode.

In embodiments, the at least two read electrodes and the at least one W/E electrode, as well as the organic semiconductive polymer, may be arranged to simplify production of the memory device by conventional printing methods, such as ink jet printing methods. For example, a memory device according to this embodiment may use a lateral device architecture where a layer of electrolyte (such as a solidified electrolyte) may be deposited so that it covers, at least partly, the at least one W/E electrode as well as covering the organic semiconductive polymer. This layer of electrolyte (such as a solidified electrolyte) may be continuous or interrupted.

In embodiments, electrochemical redox reactions may take place in the contact area between electrolyte and organic semiconductive polymer, and such reactions may change the conductivity of the organic semiconductive polymer. In embodiments, electrochemical redox reactions may take place in substantially all of the organic semiconductive polymer (such as at least about 10% of the organic semiconductive polymer undergoes a redox reaction, or at least about 20% of the organic semiconductive polymer), and such reactions may change the conductivity of the organic semiconductive polymer. In embodiments, the organic semiconductive polymer may be modified from a conducting state to a non-conducting state as a result of said redox reactions, or it is modified from a non-conducting to one or more conducting states (such as a first conductive state and a second conductive state). In embodiments, an induced redox state of the organic semiconductive polymer may be maintained for days, months, years and/or, in an ideal case, indefinitely.

In embodiments, the electrochemical reactions of the organic semiconductive polymer may be induced by one or more external stimulus, such as an applied voltage. In embodiments, a change in the redox state of the organic semiconductive polymer may be reversed by adjusting the one or more external stimulus, such as voltage. Application of a voltage between the at least one W/E electrode in the organic semiconductive polymer may result in the organic semiconductive polymer being polarized, whereby redox reactions take place in which organic semiconductive polymer may be reduced or oxidized or both.

In embodiments, the organic semiconductive polymer may comprise combinations of more than one polymer material, such as polymer blends, or several layers of polymer materials, wherein the different layers consist of the same polymer or different polymers, may also be employed. Suitable organic semiconductive polymers for use in the memory devices of the invention may be selected from the group consisting of polythiophenes, polypyrroles, polyanilines, polyfluorenes, polyisothianaphthalenes, polyphenylene vinylenes and copolymers thereof, and the like.

For example, suitable polythiophenes may include those of the following general Formula I:

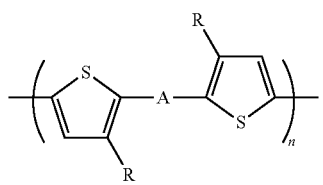

wherein A is a divalent linkage; each R is independently selected from hydrogen, alkyl, substituted alkyl, aryl, substituted aryl, alkoxy or substituted alkoxy, a heteroatom-containing group, halogen, —CN, or $NO_2$; and n is from 2 to about 5,000. In some embodiments, R is not hydrogen.

The term "alkyl" refers to a radical composed entirely of carbon atoms and hydrogen atoms which is fully saturated and of the formula $C_nH_{2n+1}$. The term "aryl" refers to an aromatic radical composed entirely of carbon atoms and hydrogen atoms. The term "alkoxy" refers to an alkyl radical which is attached to an oxygen atom.

The substituted alkyl, substituted aryl, and substituted alkoxy groups can be substituted with, for example, alkyl, halogen, —CN, or —$NO_2$. An exemplary substituted alkyl group is a perhaloalkyl group, wherein one or more hydrogen atoms in an alkyl group are replaced with halogen atoms, such as fluorine, chlorine, iodine, and bromine. The term "heteroatom-containing group" refers to a radical which is originally composed of carbon atoms and hydrogen atoms that forms a linear backbone, a branched backbone, or a cyclic backbone. This original radical is saturated or unsaturated. One or more of the carbon atoms in the backbone is then replaced by a heteroatom, generally nitrogen, oxygen, or sulfur, to obtain a heteroatom-containing group. The term "heteroaryl" refers generally to an aromatic compound containing at least one heteroatom replacing a carbon atom, and may be considered a subset of heteroatom-containing groups.

In embodiments, both R groups are alkyl having from about 6 to about 18 carbon atoms. In certain desirable examples, both R groups are the same. In further desired embodiments, both R groups are alkyl, such as —$C_{12}H_{25}$.

The divalent linkage A forms a single bond to each of the two thienyl moieties in Formula (I). Exemplary divalent linkages A include:

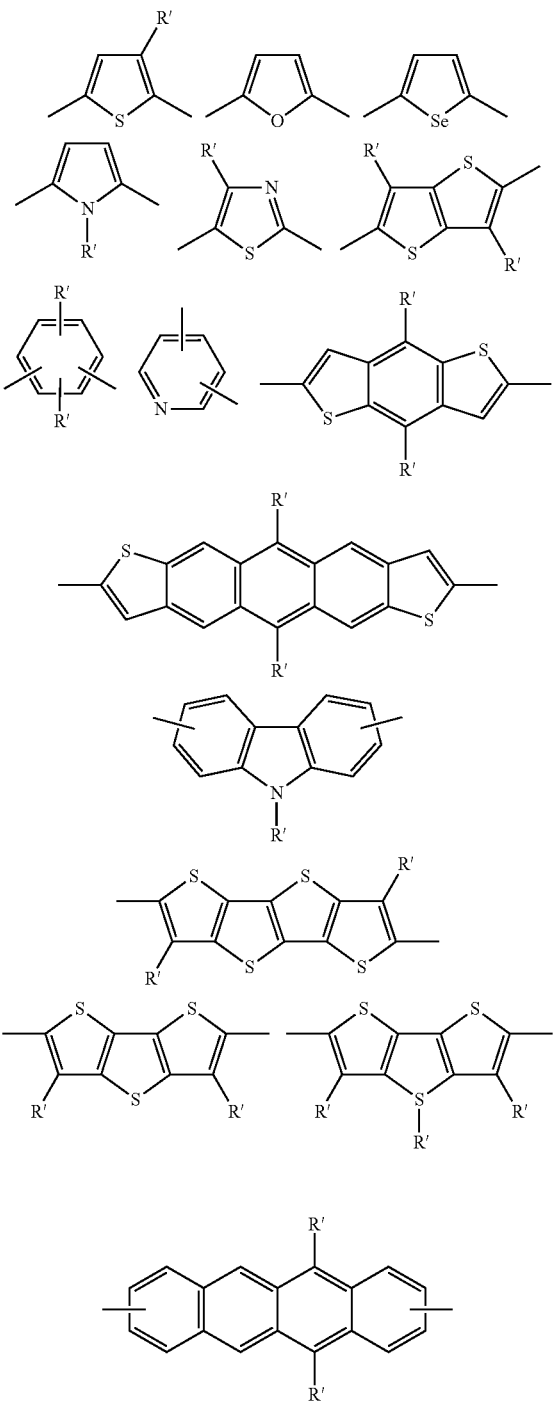

-continued

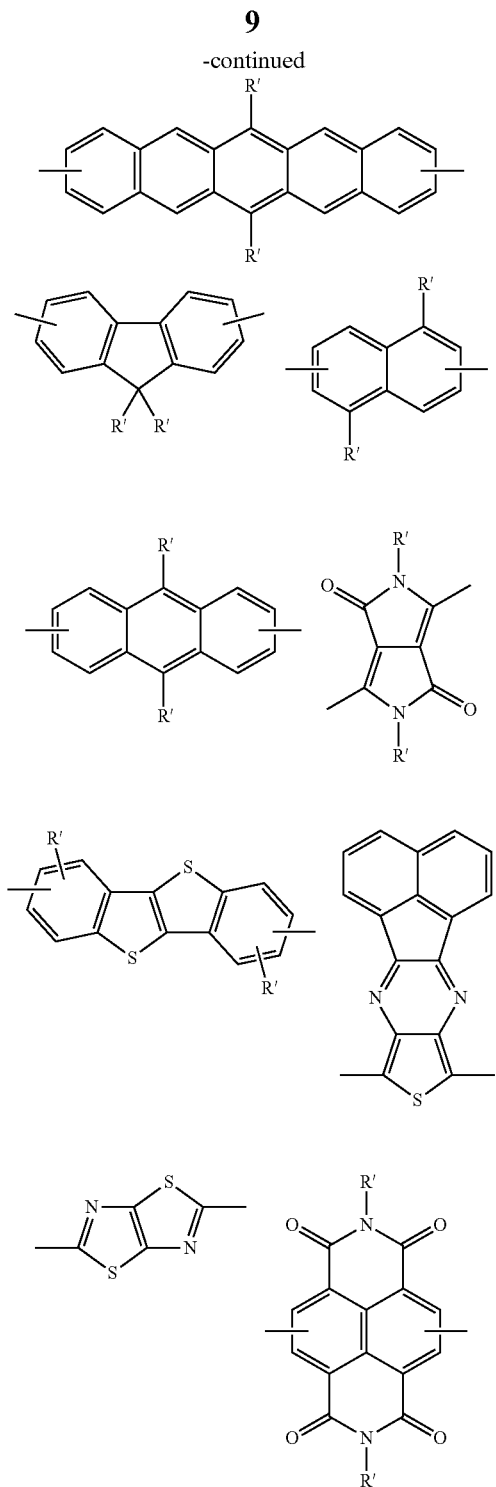

and combinations thereof, wherein each R' is independently selected from hydrogen, alkyl, substituted alkyl, aryl, substituted aryl, alkoxy or substituted alkoxy, a heteroatom-containing group, halogen, —CN, or —NO$_2$. It should be noted that the divalent linkage A will always be different from the two thiophene monomers shown in Formula (I); in other words, Formula (I) will not reduce to being a polythiophene made from only one monomer.

In embodiments, the organic semiconductor is a polythiophene of Formula (II), (III), (w), (V), (VI), or (VII):

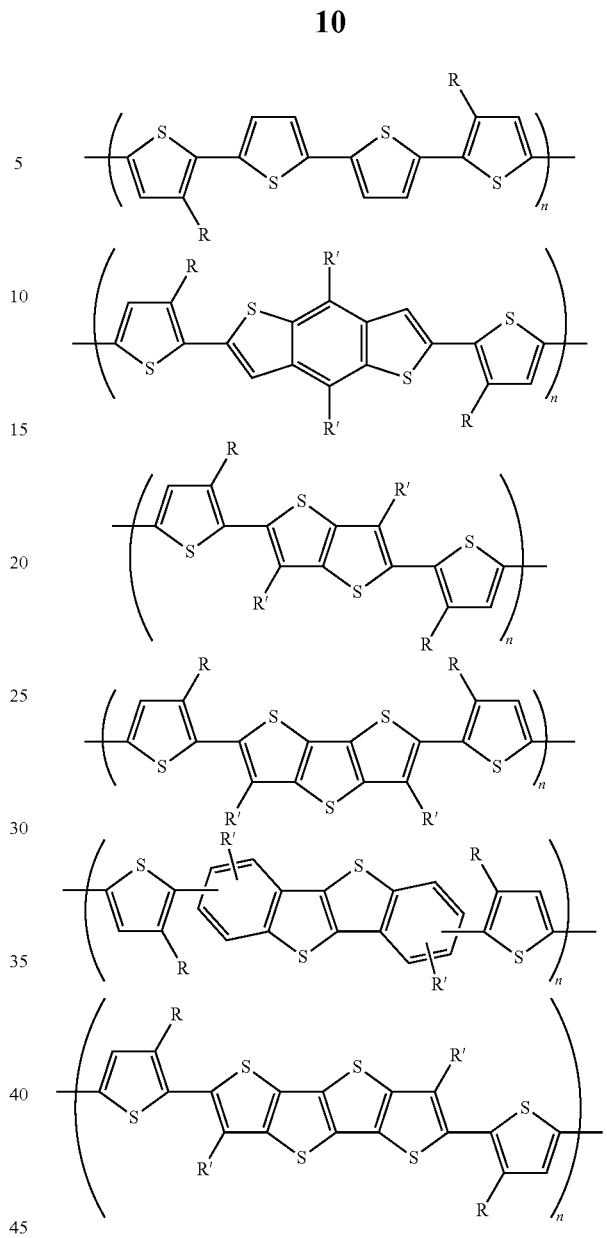

wherein each R and R' is independently selected from hydrogen, alkyl or substituted alkyl, aryl or substituted aryl, alkoxy or substituted alkoxy, a heteroatom-containing group, or halogen; and n is an integer from about 2 to about 5,000. In particular embodiments, the polythiophene is of Formula (II) and each R is alkyl.

In other embodiments, the organic semiconductor is a polythiophene of Formula (VIII):

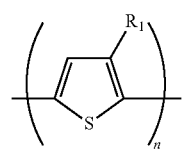

wherein R$_1$ is selected from hydrogen, alkyl or substituted alkyl, aryl or substituted aryl, alkoxy or substituted alkoxy, a heteroatom-containing group, or halogen; and n is an integer from about 2 to about 5,000.

When R or R' are alkyl, alkoxy, aryl, or their substituted derivatives thereof, they may contain from 1 to about 35 carbon atoms, or from about 1 to about 30 carbon atoms, or from about 1 to about 20 carbon atoms, or from about 6 to about 18 carbon atoms, inclusive of any side-chains. The variable n represents the number of repeating units, and may be a number from about 2 to about 5,000, about 2 to about 2,500, about 2 to about 1,000, about 100 to about 800, or from about 2 to about 100.

In embodiments, each R is independently an alkyl side-chain containing from about 6 to about 30 carbon atoms, and each R is independently selected an alkyl side-chain containing from 1 to about 5 carbon atoms. In other embodiments, each R is independently selected an alkyl side-chain containing from 0 to about 5 carbon atoms, and each R' is an alkyl side-chain containing from 6 to about 30 carbon atoms. In still other embodiments, R and R' are independently alkyl with about 1 to about 35 carbon atoms, or arylalkyl with about 7 to about 42 carbon atoms. Exemplary alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl or octadecyl. Exemplary arylalkyl groups include methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl. In particular embodiments, R and R' are represent alkyl or substituted alkyl groups having from about 1 to about 35 carbon atoms.

In a specific embodiment, the R groups are identical to each other; and the R' groups are identical to each other. In other embodiments, the R and R' groups are identical to each other. In another specific embodiment, the R and R' substituents are identical alkyl groups having from about 6 to about 18 carbon atoms.

When the organic semiconductor polymer may have a weight average molecular weight of from about 1,000 to about 1,000,000, or from about 5000 to about 100,000.

In embodiments, the memory device of the present disclosure may be produced on a flexible support. In embodiments, the different components may be deposited on the support by means of conventional printing techniques such as screen printing, offset printing, ink-jet printing and flexographic printing, or coating techniques such as knife coating, doctor blade coating, extrusion coating and curtain coating. In embodiments, organic semiconductive polymer can also be deposited through in situ polymerization by methods such as electropolymerization, UV-polymerization, thermal polymerization and chemical polymerization. As an alternative to these additive techniques for patterning of the components, it is also possible to use subtractive techniques, such as local destruction of material through chemical or gas etching, by mechanical means such as scratching, scoring, scraping or milling, or by any other known subtractive methods.

The substrate may be composed of materials including silicon, glass plate, and flexible substrates, such as a plastic film or sheet, paper, or a fabric. For structurally flexible devices, plastic substrate, such as for example polyester (such as PET, PEN), polycarbonate, polyketone (such as PEEK), polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon Further, the substrate of the present disclosure refers to, apart from an entire substance having insulation surfaces, unless provided otherwise, not only substrates made of insulation materials such as a glass substrate, a resin substrate, a resin film, etc., but also substrates made of semiconductors, metals, etc.

However, the memory device of the present disclosure is not limited to supported devices, as the electrode(s), organic semiconductive polymer and electrolyte may be arranged in such a way that they support each other. In such embodiments, the memory device of the present disclosure may be a self-supporting device.

The W/E electrode may be composed of an electrically conductive material. In embodiments, it may be a thin metal film, a conducting polymer film, a conducting film made from conducting ink or paste or the substrate itself, for example heavily doped silicon. Examples of W/E electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The W/E electrode can be prepared by vacuum evaporation, sputtering of metals or conductive metal oxides, conventional lithography and etching, chemical vapor deposition, spin coating, casting or printing, or other deposition processes. The thickness of the W/E electrode ranges from about 10 to about 500 nanometers for metal films and from about 0.5 to about 10 micrometers for conductive polymers.

Typical materials suitable for use as read electrodes include materials such as gold, silver, nickel, aluminum, platinum, conducting polymers, and conducting inks. In specific embodiments, the electrode materials provide low contact resistance to the semiconductor. Typical thicknesses are about, for example, from about 10 nanometers to about 1 micrometer, such as from about 100 to about 400 nanometers. The electrodes may be formed or deposited using conventional processes known in the art.

If desired, an interfacial layer may be placed between the electrolyte layer and the organic semiconducting polymer layer.

In embodiments, the memory device of the present disclosure may be encapsulated, in part or entirely, for protection of the device. The encapsulation may improve retention of any solvent needed, such as a solvent for the electrolyte (such as a solidified electrolyte) to function. In particular embodiments where atmospheric oxygen may be a concern, encapsulation may also help keep oxygen from disturbing the electrochemical reactions in the memory device. Encapsulation can be achieved through any conventional method, such as liquid phase processes. For example, a liquid phase polymer or organic monomer can be deposited on the memory device using methods such as spray-coating, dip-coating or any of the conventional printing techniques listed above. After deposition, the encapsulant can be hardened for example by ultraviolet or infrared irradiation, by solvent evaporation, by cooling or through the use of a two-component system, such as an epoxy glue, where the components are mixed together directly prior to deposition. Alternatively, the encapsulation is achieved through lamination of a solid film onto the memory device.

If desired, a selective barrier layer may also be deposited on top of the memory device to protect it from environmental conditions, such as light, oxygen and moisture, etc. Such barrier layers are known in the art and may simply consist of polymers.

In embodiments, by doping a charge-transfer-type dopant substance in the organic semiconductor polymer, it is possible to enhance the conductivity further. As the dopant substance, any dopant substance may be used, such as iodine, alkali metals such as Na and K, alkaline earth metals such as Ca, precious metal such as Au, Ag, Pd, Pt, etc. Further, other dopant substances such as metal oxide or salts (e.g. $Fe_2O_3$, $Al_2O_3$, ZnO) may be included during the organic semiconductive polymer forming process.

The various components of the memory device may be deposited upon the substrate in any order, as is seen in the Figures. The term "upon the substrate" or "on the substrate" should not be construed as requiring that each component directly contact the substrate. The term should be construed as describing the location of a component relative to the substrate. Generally, however, the organic semiconducting polymer layer should be in contact with the electrolyte layer. In addition, the read electrodes should both be in contact with the organic semiconducting polymer layer. The organic semiconductor polymer layer may be formed by any conventional methods known in the art. In embodiments, the memory device of the present disclosure may be deposited onto any appropriate component, such as a flexible component.

In the present disclosure, an organic semiconductive polymer memory as a non-volatile memory may be composed of an organic semiconductive polymer as a storage medium, a first line arranged in the vicinity of the organic semiconductive polymer for bringing the organic semiconductive polymer into conduction, and a second line arranged in the vicinity of the organic semiconductive polymer for detecting whether the organic semiconductive polymer is in a first conductive state, a second conductive state or non-conductive.

Further, a memory input/output method may be configured in the following manner. Organic semiconductive polymers are used as storage media, and for each of the organic semiconductive polymers, at least one line for bringing the organic semiconductive polymer into conduction is arranged in the vicinity of the organic semiconductive polymer so that memory is written by bringing the organic semiconductive polymer into conduction using the line. Further, for each of the organic semiconductive polymers, at least one line for detecting the conduction of the organic semiconductive polymer is arranged in the vicinity of the organic semiconductive polymer so that memory is read.

As to an application example of the memory, the memory device of the present disclosure may be suitable for use in a memory card or a computer system, as an auxiliary storage medium that does not need backup with use of a battery, since the foregoing memory device stores information even after the power is turned off. Further, because it is non-volatile, it is capable of functioning as a part of a HDD (hard disk). By using the memory element for the foregoing purposes, the following functions may be achieved: higher-density packaging, thereby producing large-capacity storage devices at lower cost, stability in maintaining memory, and increased speed for input/output of memory.

EXAMPLES

Example 1

Figure 2:
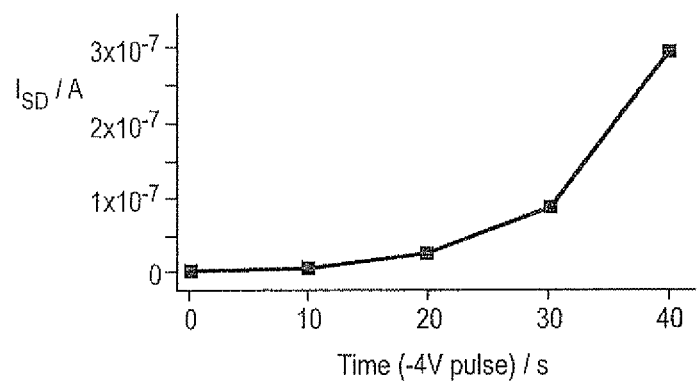
FIG. 2 is a graphic representation showing the effect of successive "activation" pulses on the current between R1 and R2 during operation of a memory device with the structure illustrated in FIG. 1 containing poly 3-hexyl thiophene.
Figure 3:
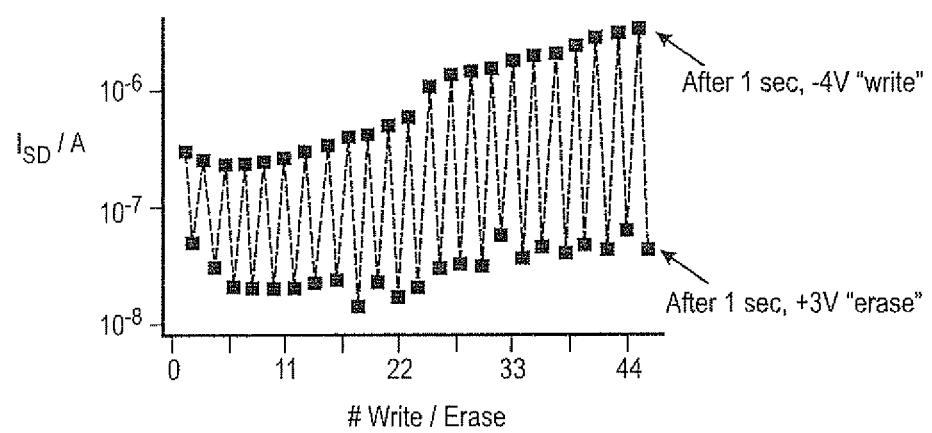
FIG. 3 is a graphic representation showing approximately 40 write/erase cycles and repeated switching of the current between R1 and R2 (measured for a 0.1 V bias) during operation of a memory device with the structure illustrated in FIG. 1, which contains poly 3-hexyl thiophene.

Operation of the structure shown in FIG. 1 as a memory device is illustrated in FIGS. 2 and 3, for the case of poly(3-hexyl thiophene) as the polymer. After a 40 second "activation" period, the conductance of the polymer layer was repeatedly switched between high and low conductance states. FIG. 2 illustrates the operation of a memory device with the structure of FIG. 1 containing Poly 3-hexyl thiophene as the polymer layer and shows the effect of successive "activation" pulses on the current between R1 and R2. FIG. 3 shows approximately 40 write/erase cycles, demonstrating repeated switching of the current between R1 and R2 (measured for a 0.1 V bias).

Figure 4:
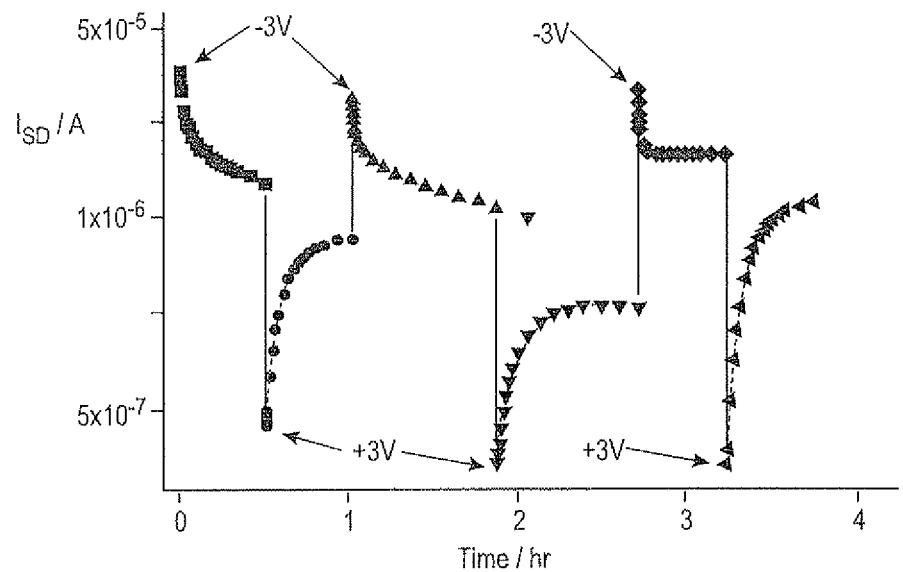
FIG. 4 is a graphic representation showing the behaviour of the current between R1 and R2 following +3 and −3 V "erase" and "write" pulses during operation of a memory device with the structure illustrated in FIG. 1, which contains poly 3-hexyl thiophene.

FIG. 4 shows the behavior of the current between R1 and R2 (measured for a 0.1 V bias) following +3 and −3 V "erase" and "write" pulses showing approximately 1 hour stability of ON and OFF states. The ON or OFF states are easily discernible for at least several hours after the pulses, indicating a retention time of several hours. Modification to the device composition can extend the retention and result in much longer retention times, with larger difference between the ON and OFF states.

Example 2

Figure 5:
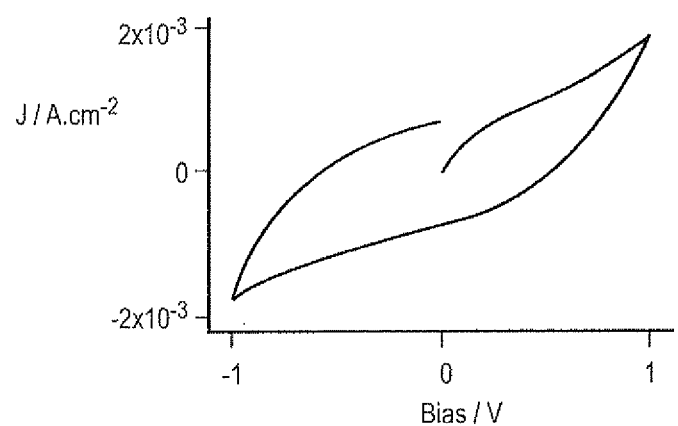
FIG. 5 is a graphic representation of the leakage current measured between two electrodes of the two terminal junction fabricated in Example 2.

A two terminal junction fabricated to monitor the polaron formation in polythiophene semiconductor. Similar to 3-terminal device, e-beam silicon oxide, saturated with ambient $H_2O$, was used as the electrolyte layer. To confirm the porous nature of the silicon oxide layer, the current density of the device was measured. As in FIG. 5, there was a large leakage current between two electrodes, indicating porous characteristics or pinholes in the silicon oxide layer.

Figure 6:
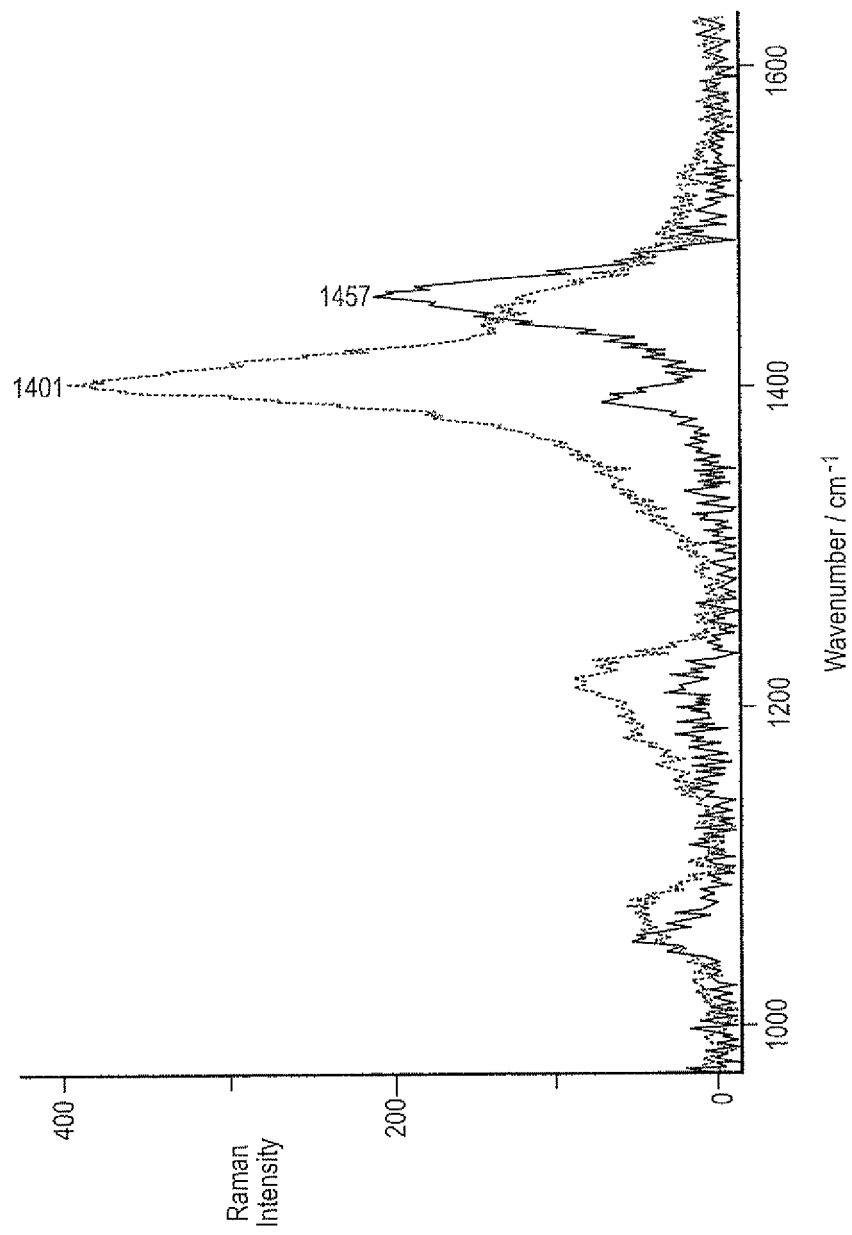
FIG. 6 is a graphic representation of Raman spectra obtained for organic semiconducting polymer polythiophene in a de-doped state (curve 1) where a vibrational band at 1457 $cm^{-1}$ was observed, and a electrochemically doped state (curve 2) where the band shifted to 1401 $cm^{-1}$ due to the formation of polaron.

Upon applying voltage to the device, for example from +5 to −5 V, the semiconductor underwent reversible electro-chemical doping and de-doping. As a result, the Raman spectra (FIG. 6) changed dramatically. In de-doped state (curve 1), a vibrational band at 1457 $cm^{-1}$ was observed, while the band shifted to 1401 $cm^{-1}$ upon electrochemically doping due to the formation of polaron (curve 2).

Example 3

Similar to Example 1, poly(quarter thiophene) (PQT) was used as the semiconductive polymer, and viologen $LiClO_4$ dispersed in PEO was used as the electrolyte layer to fabricate the memory device having the structure shown in FIG. 1. The PQT/viologen devices remain viable under vacuum, and do not require activation pulses to reach usable on/off ratios. Importantly, the devices show excellent stability of "on" and "off" currents, and significant on/off ratios of $10^3$-$10^4$. Devices were subjected to 100 cycles without breakdown and without significant drift in source-drain currents. PQT/viologen memory devices were further studied using Raman microscopy. In addition to confirming previous observations of the correlation of the high-conductance state with the creation of polarons, we are now able to monitor the concurrent emergence of the reduced viologen species, thus supporting the redox model for the memory device of the present disclosure.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A three-terminal non-volatile memory device, comprising:
   at least a first electrode and a second electrode provided on a substrate, the first and second electrodes being in contact with an organic semi-conductive polymer and separated from each other such that, the first electrode and second electrode electronically determine a first redox state, a second redox state, or a third redox state of the organic semiconductive polymer;
   an active layer comprising the organic semiconductive polymer electrically connecting the first and second electrodes;
   an electrolyte layer in contact with the active layer, wherein the active layer and the electrolyte are two separate layers; and
   a third electrode that is not in contact with the first electrode, the second electrode, and the organic semiconductive polymer; wherein
   the organic semiconductive polymer has the first redox state in which the organic semiconductive polymer exhibits conductivity in a neutral state of $10^{-8}$ S/cm to $10^{-3}$ S/cm at room temperature, the second redox state in which the organic semiconductive polymer exhibits conductivity greater than 0.001 S/cm to 10 S/cm at room temperature, and the third redox state in which the organic semiconductive polymer exhibits conductivity less than 0.001 S/cm or less than 10 S/cm at room temperature, wherein a "read" circuit does not pass through the electrolyte, and a write/erase" circuit passes current through the electrolyte, further wherein the organic semiconductive polymer contains mobile ions.

2. The three-terminal non-volatile memory device according to claim 1, wherein the third electrode is in contact with the electrolyte.

3. The three-terminal non-volatile memory device according to claim 1, wherein the first conductivity is greater than about 0.001 S/cm at room temperature, and wherein the second conductivity is at least 10 times less than the first conductivity.

4. The three-terminal non-volatile memory device according to claim 1, wherein the second conductivity is less than about 0.1 S/cm at room temperature, and wherein the first conductivity is at least 10 times higher than the second conductivity.

5. The three-terminal non-volatile memory device according to claim 1, wherein a ratio of the first conductivity to the second conductivity is greater than about 10.

6. The three-terminal non-volatile memory device according to claim 1, wherein a ratio of the first conductivity to the second conductivity is in the range of from about 10 to about $10^{10}$.

7. The three-terminal non-volatile memory device according to claim 1, wherein the electrolyte comprises mobile ions.

8. The three-terminal non-volatile memory device according to claim 1, wherein the mobile ions are selected from the group consisting of positive ions, negative ions, metal ions, hydroxyl ions, and hydrogen ions.

9. The three-terminal non-volatile memory device according to claim 1, wherein the first and second electrodes are formed substantially parallel with each other.

10. The three-terminal non-volatile memory device according to claim 1, wherein the organic semiconductive polymer further comprises a dopant substance.

11. The three-terminal non-volatile memory device according to claim 10, wherein the dopant substance is selected from the group consisting of iodine, alkali metals, Na, K, alkaline earth metals, Ca, precious metals, metal oxide, $Fe_2O_3$, $Al_2O_3$, ZnO, and metal salts.

12. The three-terminal non-volatile memory device according to claim 1, wherein said electrolyte layer is a solid electrolyte.

13. The three-terminal non-volatile memory device according to claim 10, wherein the solid electrolyte contains an ion conductive polymer and an electrolyte salt.

14. The three-terminal non-volatile memory device according to claim 1, wherein organic semiconductive polymer is selected from the group consisting of polythiophene, polypyrrole, polyanniline, and polyfluorene.

15. The three-terminal non-volatile memory device according to claim 1, wherein the device further comprises a complementary redox agent.

16. The three-terminal nonvolatile memory device according to claim 15, wherein the device comprises a layer comprising a complementary redox agent, wherein the layer is in contact with the third electrode and is separated from the organic semiconductor polymer layer by the electrolyte layer.

17. The three-terminal non-volatile memory device according to claim 1, wherein the organic semiconductive polymer is switched to the first redox state via an oxidation/reduction reaction.

18. The three-terminal non-volatile memory device according to claim 17, wherein the first redox state of the organic semiconductive polymer is switched to the second redox state of the organic semiconductive polymer via an oxidation/reduction reaction.

19. The three-terminal non-volatile memory device according to claim 17, wherein the oxidation/reduction takes place at the surfaces of the first electrode and the second electrode; and the device further comprises complementary oxidation/reduction, relative to the first and second electrodes, at the surface of the third electrode.

20. The three-terminal non-volatile memory device according to claim 1, wherein the first electrode and second electrode electronically determine the first redox state or the second redox state of the organic semiconductive polymer by providing an electronic charge to the semiconductive polymer.

21. The three-terminal non-volatile memory device according to claim 1, wherein the first electrode and second electrode electronically determine the first redox state or the second redox state of the organic semiconductive polymer by sensing an electronic charge of the semiconductive polymer.

22. A system comprising:
    a memory: and
    a memory controller configured to control the execution of programming and erase operations within the memory, wherein the memory comprises a three-terminal non-volatile memory device, the three-terminal non-volatile memory device including:
    at least a first electrode and a second electrode provided on a substrate, the first and second electrodes being in contact with an organic semiconductive polymer and separated from each other such that, the first electrode and second electrode electronically determine a first redox state, a second redox state, or a third redox state of the organic semiconductive polymer;

an active layer comprising the organic semiconductive polymer electrically connecting the first and second electrodes;

an electrolyte layer in contact with the active, wherein the active layer and the electrolyte are two separate layers; and a third electrode that is not in contact with the first electrode, the second electrode, and the organic semiconductive polymer; wherein the organic semiconductive polymer has the first redox state in which the organic semiconductive polymer exhibits a first conductivity in a neutral state of $10^{-8}$ S/cm to $10^{-3}$ S/cm at room temperature, the second redox state in which the organic semiconductive polymer exhibits conductivity greater than 0.001 S/cm to 10 S/cm at room temperature, and the third redox state in which the organic semiconductive polymer exhibits conductivity less than about 0.001 S/cm or less than 10 S/cm, at room temperature, wherein a "read" circuit does not pass through the electrolyte, and a write/erase" circuit passes current through the electrolyte, further wherein the organic semiconductive polymer contains mobile ions.

\* \* \* \* \*